US 11,336,295 B2

(12) United States Patent
Hecker et al.

(10) Patent No.: US 11,336,295 B2
(45) Date of Patent: May 17, 2022

(54) SYSTEMS AND METHODS FOR VERSION CHAIN CLUSTERING

(71) Applicant: Exagrid Systems, Inc., Westborough, MA (US)

(72) Inventors: Mark Bennett Hecker, Northborough, MA (US); Ashok T. Ramu, Waltham, MA (US)

(73) Assignee: Exagrid Systems, Inc., Marlborough, MA (US)

(*) Notice: Subject to any disclaimer, the term of this patent is extended or adjusted under 35 U.S.C. 154(b) by 91 days.

(21) Appl. No.: 16/698,140

(22) Filed: Nov. 27, 2019

(65) Prior Publication Data
US 2020/0099392 A1 Mar. 26, 2020

Related U.S. Application Data

(63) Continuation of application No. 13/273,082, filed on Oct. 13, 2011, now Pat. No. 10,498,356.
(Continued)

(51) Int. Cl.
*H03M 7/30* (2006.01)
*G06F 16/174* (2019.01)

(52) U.S. Cl.
CPC ...... *H03M 7/3091* (2013.01); *G06F 16/1756* (2019.01); *H03M 7/3093* (2013.01)

(58) Field of Classification Search
CPC .............. H03M 7/3091; H03M 7/3093; G06F 16/1756
See application file for complete search history.

(56) References Cited

U.S. PATENT DOCUMENTS 5,574,906 A  11/1996 Morris
5,729,743 A  3/1998 Squibb
(Continued)

FOREIGN PATENT DOCUMENTS

EP   0774720 B1   5/1997
EP   0981099 A2   2/2000
(Continued)

OTHER PUBLICATIONS

Algorithms for Delta Compression and Remote File Synchronization (Suel, Memon); 2002.
(Continued)

*Primary Examiner* — Huawen A Peng
(74) *Attorney, Agent, or Firm* — Mintz Levin Cohn Ferris Glovsky and Popeo, P.C.

(57) ABSTRACT

A system, a method and a computer program product for storing data, which include receiving a data stream having a plurality of transactions that include at least one portion of data, determining whether at least one portion of data within at least one transaction is substantially similar to at least another portion of data within at least one transaction, clustering together at least one portion of data and at least another portion of data within at least one transaction, selecting one of at least one portion of data and at least another portion of data as a representative of at least one portion of data and at least another portion of data in the received data stream, and storing each representative of a portion of data from each transaction in the plurality of transactions, wherein a plurality of representatives is configured to form a chain representing the received data stream.

30 Claims, 5 Drawing Sheets

Related U.S. Application Data (60) Provisional application No. 61/534,166, filed on Sep. 13, 2011.

(56) References Cited

U.S. PATENT DOCUMENTS

| | | | |
|---|---|---|---|
| 5,813,017 | A | 9/1998 | Morris |
| 7,562,186 | B2 | 7/2009 | Li et al. |
| 7,962,520 | B2 | 6/2011 | Patterson et al. |
| 8,412,848 | B2 | 4/2013 | Therrien et al. |
| 8,447,740 | B1 | 5/2013 | Huang et al. |
| 8,812,738 | B2 | 8/2014 | Therrien et al. |
| 8,898,120 | B1 | 11/2014 | Efstathopoulos |
| 8,972,672 | B1 | 3/2015 | Wallace et al. |
| 10,498,356 | B2 | 12/2019 | Hecker et al. |
| 2002/0073106 | A1 | 6/2002 | Parker et al. |
| 2006/0136513 | A1 | 6/2006 | Ngo et al. |
| 2007/0239945 | A1 | 10/2007 | Li et al. |
| 2007/0250671 | A1* | 10/2007 | Lyon ............... G06F 11/1453 711/162 |
| 2008/0077607 | A1 | 3/2008 | Gatawood et al. |
| 2008/0195677 | A1 | 8/2008 | Sudhakar et al. |
| 2008/0270729 | A1 | 10/2008 | Reddy et al. |
| 2008/0294660 | A1 | 11/2008 | Patterson et al. |
| 2010/0306412 | A1 | 12/2010 | Therrien et al. |
| 2011/0119240 | A1 | 5/2011 | Shapira |
| 2012/0059804 | A1* | 3/2012 | Tapply ............... H03M 7/40 707/693 |
| 2012/0303680 | A1 | 11/2012 | McLennan et al. |
| 2013/0024435 | A1 | 1/2013 | Poirier et al. |
| 2014/0052700 | A1 | 2/2014 | Vanderspek et al. |
| 2016/0253351 | A1 | 9/2016 | Hansen et al. |
| 2017/0046360 | A1 | 2/2017 | Therrien et al. |

FOREIGN PATENT DOCUMENTS

| | | |
|---|---|---|
| EP | 2571171 A2 | 3/2013 |
| EP | 2698732 A1 | 2/2014 |
| EP | 3062227 A1 | 8/2016 |
| EP | 2 256 934 A1 | 12/2020 |
| EP | 2 256 934 B1 | 12/2020 |
| WO | WO-01/52116 A1 | 7/2001 |
| WO | WO-01/52116 A8 | 7/2001 |

OTHER PUBLICATIONS

Anonym: "Database transaction", Wikipedia, Apr. 13, 2011, pp. 1-3, Retrieved from the Internet: URL:http://web.archive.org/web/20110413204702/http://en.wikipedia.org/wiki/Database transaction.

Anonym: "Transaction processing system",Wikipedia, Feb. 19, 2011, pp. 1-6, Retrieved from the Internet: URL:http://web.archive.org/web/20110219211439/http://en.wikipedia.org/wiki/TransactionProcessing System.

Randal C. Burns, Efficient Distributed Backup with Delta Compression, 1997.

Efficient Distributed Backup with Delta Compression (Burns, Long); 1997.

European Search Report and Written Opinion for EP12184324, dated Mar. 18, 2013.

Extended European Search Report dated Nov. 22, 2013, for EP Application No. 13180747.1, filed Aug. 16, 2013, 5 pages.

Extended European Search Report dated Aug. 2, 2016, for EP Application No. 16157662.4, filed Feb. 26, 2016, 7 pages.

Extended European Search Report dated Mar. 23, 2017, for EP Application No. EP16184063.2, filed on Aug. 12, 2016, 8 pages.

File System Support for Delta Compression (Josh P. MacDonald); 2000.

Time and Space Tradeoffs in Version Control (Eric Sink); 2009.

1997 Research Paper, *Efficient Distributed Backup with Delta Compression* (Randal C. Burns, Darrell D.E. Long).

2000 Research Paper, *File System Support for Delta Compression* (Joshua P. MacDonald).

2002 Research Paper, *Cluster-based Delta Compression of a Collection of Files* (Zan Ouyang, Nasir Memon, Torsten Suel, Dimitre Trendafilov).

Extended European Search Report dated Mar. 15, 2021, for EP Patent Application No. 20195700.8, 9 pages.

* cited by examiner

SYSTEMS AND METHODS FOR VERSION CHAIN CLUSTERING

CROSS-REFERENCE TO RELATED APPLICATIONS

The present application is a continuation of and claims priority to U.S. patent application Ser. No. 13/273,080 to Hecker et al., filed Oct. 13, 2011, and entitled "Systems and Methods for Version Chain Clustering", now U.S. Pat. No. 10,498,356, issued Dec. 3, 2019, which claims priority to U.S. Patent Provisional Application No. 61/534,166 to Ramu et al., filed Sep. 13, 2011, and entitled "Version Chain Clustering" and incorporates the disclosures of these applications herein by reference in their entireties.

TECHNICAL FIELD

The subject matter described herein relates to data processing and in particular, to more efficiently process data contained in delta-compressed version chains through version chain clustering.

BACKGROUND

Data processing applications allow their users to create, change, modify, and delete files over time. A file version represents a particular iteration of a file at a point in time. Such iterations can be the same or can be different from the originally created file and/or from its other versions. Some files may have no versions (i.e., only a single original file), only a few versions, or a plurality of versions. An efficient way to store versions of files or segments of files over time is by delta compressing versions against each other and storing them in a version chain. Version chains are typically linear data structures that hold contents of versions of the same or similar files or segments of files over time. For example, a segment that is originally created and then modified four times can have a version chain consisting of four versions, which would represent a version of the file or file segment at four different points in time.

To reduce storage space, file versions are typically stored in a compressed format, such as a delta-compressed format. Delta compression or delta encoding is a way of storing or transmitting data in the form of differences between versions of a file or file segment rather than complete files. The differences are recorded in discrete files, which are called "deltas."

In some cases, the version chains can be represented as linear reverse delta version chains, where the most recent version is stored in its whole form and all earlier versions could be stored as difference/delta files from each other in the linear chain. Conversely, a forward delta version chain maintains the first version of a file in its whole form, and creates delta files forward from that first version.

While a linear arrangement of delta versions can be one of the simplest data structures for version chains, there are operations on version chains that make the linear arrangement of deltas inefficient, more prone to data loss, and/or cumbersome, as indicated below.

One of these operations includes accessing an earlier version of a file, which is a linear process whose processing time is directly proportional to the position of that version along the length of the version chain. The shorter the distance from the most recent version to the desired version within the reverse delta version chain, the faster the execution time to recreate that earlier version. However, this operation can consume a greater amount of time and processing power as the distance from the most recent version to the desired version increases.

Another operation includes deleting a single delta version from anywhere in the version chain except the ends of the chain. This can require decompressing of all more recent versions of the version to be deleted in order to remove that version and reconnect its two adjacent versions to each other. This can again be a time-and-processing intensive operation.

If a delta version within a version chain is determined to have become corrupted, all earlier versions are rendered unavailable since their regeneration is based on all of the more recent versions to be error free. Hence, there is a need to reduce the probability of data loss by significantly reducing the number of deltas that must be error free in order to successfully restore an earlier version of a segment or file.

Version chains are typically arranged in a linear format. Version chains can also be implemented in a binary tree data structure to reduce the overall time in accessing earlier versions. However, if a primary goal of a version chain is to minimize data storage capacity, and it is assumed that two versions adjacent in time can produce a smaller delta file than two versions separated by a larger period of time, then a binary tree version chain can produce suboptimal data storage compression.

Thus, there is a need for a system and method for storing data that involves an improved delta version chain data structure, where the structure can be configured to mitigate various issues with the linear and binary-tree structures discussed above.

SUMMARY

In some implementations, the current subject matter relates to a computer-implemented method for storing data. The method includes receiving a data stream, wherein the data stream includes a plurality of transactions, each transaction in the plurality of transactions includes at least one portion of data from the received data stream, determining whether the at least one portion of data within at least one transaction in the plurality of transactions is substantially similar to at least another portion of data within the at least one transaction, clustering together the at least one portion of data and at least another portion of data within the at least one transaction, selecting one of the at least one portion of data and the at least another portion of data as being a representative of the at least one portion of data and the at least another portion of data in the received data stream, and storing each representative of a portion of data from each transaction in the plurality of transactions, wherein a plurality of representatives is configured to form a version chain representing parts of the received data stream. At least one of the receiving, the determining, the clustering, the selecting, and the storing is performed on at least one processor.

In some implementations, the current subject matter can be configured to include at least one of the following optional features. At least one portion of data can be at least one compressed portion of data and at least another portion of data can be at least another compressed portion of data. The representative can be a compressed representative of the at least one portion of data and the at least another portion of data. The representative can be a delta-compressed representative of at least one portion of data and at least another portion of data. The portions of data that are not selected representatives can be configured to be independent of each other, thereby reducing a number of dependencies among the portions of data that are not selected representatives.

The method can include determining whether a third portion of data included in at least one transaction within the plurality of transaction is designated for deletion, determining a representative that designates the third portion of data, and deleting the representative that designates the third portion of data, and deleting all portions of data that the representative that designates the third portion of data is configured to represent. The method can include determining whether a third portion of data included in at least one transaction within the plurality of transaction is designated for deletion, determining a representative that designates the third portion of data, and deleting the third portion of data without deleting the representative that designates the third portion of data or other portions of data that the representative that designates the third portion of data is configured to represent. At least one portion of data can be configured to be a version of a data file within the received data stream and at least another portion of data can be configured to be another version of the data file within the received data stream. The version of the data file and another version of the data file can be compressed.

The storing can further include storing compressed versions of the data file in at least one storage location.

The method can include uncompressing the representative of the at least one portion of data and the at least another portion of data, retrieving, based on the uncompressing, at least one of an uncompressed version and an uncompressed another version of the data file from the at least one storage location. The processing time for the retrieving can be based on a number of representatives configured to represent at least one transaction in the plurality of transactions and configured to be uncompressed to retrieve the uncompressed version.

The method can further include repeating the determining, the clustering, and the selecting for each portion of the data in the received data stream.

The method can also include storing portions of data that are not selected as a representative.

In some embodiments, the clustered at least one portion of data and the clustered at least another portion of data are configured to have no dependencies on one another.

Articles are also described that comprise a tangibly embodied machine-readable medium embodying instructions that, when performed, cause one or more machines (e.g., computers, etc.) to result in operations described herein. Similarly, computer systems are also described that can include a processor and a memory coupled to the processor. The memory can include one or more programs that cause the processor to perform one or more of the operations described herein.

The details of one or more variations of the subject matter described herein are set forth in the accompanying drawings and the description below. Other features and advantages of the subject matter described herein will be apparent from the description and drawings, and from the claims.

Articles are also described that comprise a tangibly embodied machine-readable medium embodying instructions that, when performed, cause one or more machines (e.g., computers, etc.) to result in operations described herein. Similarly, computer systems are also described that can include a processor and a memory coupled to the processor. The memory can include one or more programs that cause the processor to perform one or more of the operations described herein.

The details of one or more variations of the subject matter described herein are set forth in the accompanying drawings and the description below. Other features and advantages of the subject matter described herein will be apparent from the description and drawings, and from the claims.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

To address these and potentially other deficiencies of currently available solutions, one or more implementations of the current subject matter provide methods, systems, articles or manufacture, and the like that can, among other possible advantages, provide systems and methods for providing systems, methods, and computer program products for storing data.

There are many applications that leverage version chains and delta compression. Software source control systems efficiently manage multiple versions of source files over time so that a user is capable of acquiring any earlier version of a file. Backup systems can store day to day backups in version chains using delta compression to eliminate redundancy among successive backups. Computer file systems have also been designed to maintain the history of files over time using version chains. The current subject matter can be configured to work with reverse delta version chains and/or forward delta version chains.

For any of these applications, within the stream of data to be versioned, there can exist segments that can be similar or substantially identical in content. By identifying these similar/identical segments and grouping each of them together into version chains, and applying delta compression between successive pairs of historical or content-similar versions, the overall consumed capacity of these similar segments can be dramatically reduced by factors up to 1,000,000:1 or greater.

Each stream of data can be segmented into smaller logical entities, which can be referred to as transactions. For example, a weekend backup of 20 terabytes ("TB") of data may be segmented into 200 transactions of 100 gigabytes ("GB") each. Transactions can be entities within the data stream that can be created and/or deleted/purged as a complete unit. Distinct segments of data within each transaction can be similar or substantially identical to one another.

Conventional systems typically serially link a transaction's segments of identical or similar data into a version chain as well as segments that are found to be similar or identical among multiple transactions. This has the potential to create version chains that are thousands of versions or more in length. The length of a version chain can be problematic for operations such as deleting a version from the middle of a version chain or recreating an earlier version of a file. Also, in a chain of a thousand versions, if a single version is found to have become corrupt in the linear list of versions, all earlier versions can be rendered unavailable.

In some implementations, to address the above, the current subject matter can be configured to recognize that the data within each transaction of a data stream can have similar or substantially identical content and can use that similarity within a transaction to create a cluster of versions with a single version being attached to a main trunk (which can include a collection of versions of data) of the serial version chain. One of the advantages of such clustering can include a reduction of an amount of processing involved to delete one or more versions from a version chain, where the reduction depends on a degree of clustering. Another advantage is the reduction in processing time for restoring an early version of a file within the chain, since fewer delta decompressions have to be performed. A further advantage of the current subject matter can include reducing a probability of data loss by significantly reducing the number of deltas that must be error free in order to restore an earlier version. A shorter serial main trunk can reduce a probability of a single version corrupting all other earlier versions by the factor of the degree of clustering. In some implementations, the current subject matter relates to a method, a system and a computer program product for storing data within a version chain that can minimize the length of the version chain and allow a more efficient processing of the versions within a version chain.

Figure 1:
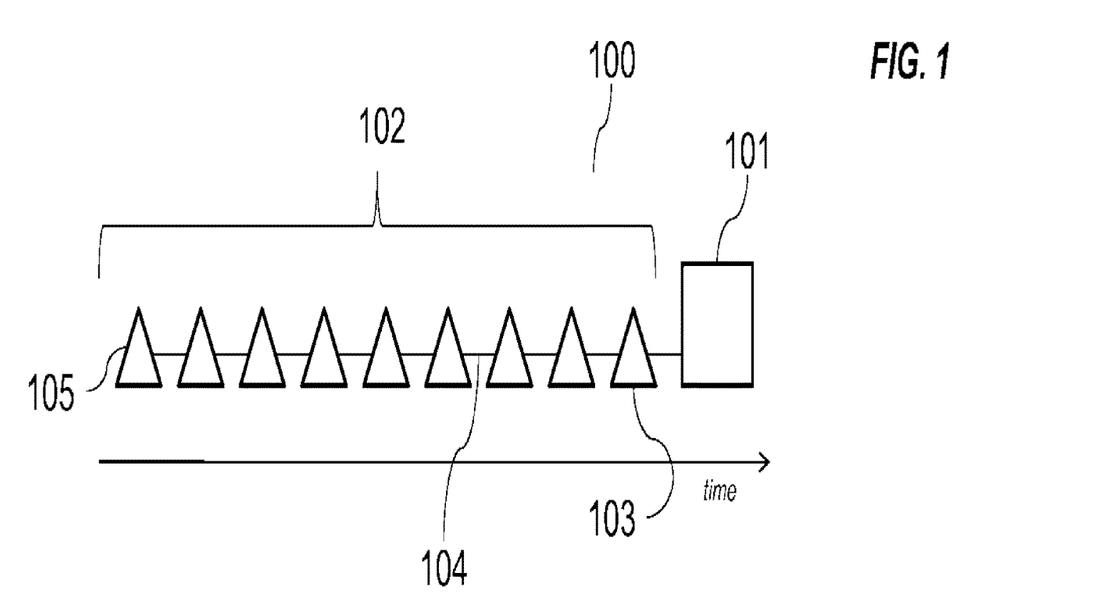
FIG. 1 illustrates an exemplary linear version chain.

FIG. 1 illustrates an exemplary conventional linear version chain 100 configured to employ delta compression. The version chain 100 includes a main trunk 104 having a most recent version 101 (represented by a square in FIG. 1) and a plurality of earlier versions 102 (represented by triangles). The version chain 100 can represent an efficient storage of ten versions of a single file. It can also represent ten versions of segments of data from a data stream that can be similar to one another. The most recent version 101 of a data file can be stored in its whole form (e.g., in its entirety) and/or can be data compressed using a common data compression algorithm, such as, gzip, Lempel-Ziv, and/or any other suitable method. The plurality of earlier versions 102 can be stored as difference and/or delta compressed files that are created by only storing the different bytes between successive versions.

To recreate an entire previous version 103, the most recent version 101 and the delta (or stored difference) from the previous version 103 can be combined and the combination can be un-delta-compressed to turn that delta into a full file. Thus, recreation of the first version 105 of the file, can involve similar combination and decompression operations of all versions 102 of the file in the serial link of versions between file 101 and the version 105. As shown in FIG. 1, nine different combination and delta-decompression operations can recreate the original file. Larger version chains can involve greater number of combination/decompression operations and thus, can consume greater amount of processing time and power. One of the advantages of the current subject matter is that it can reduce the serial length of a version chain through version chain clustering and can accelerate the re-creation of earlier versions within a version chain.

Figure 2:
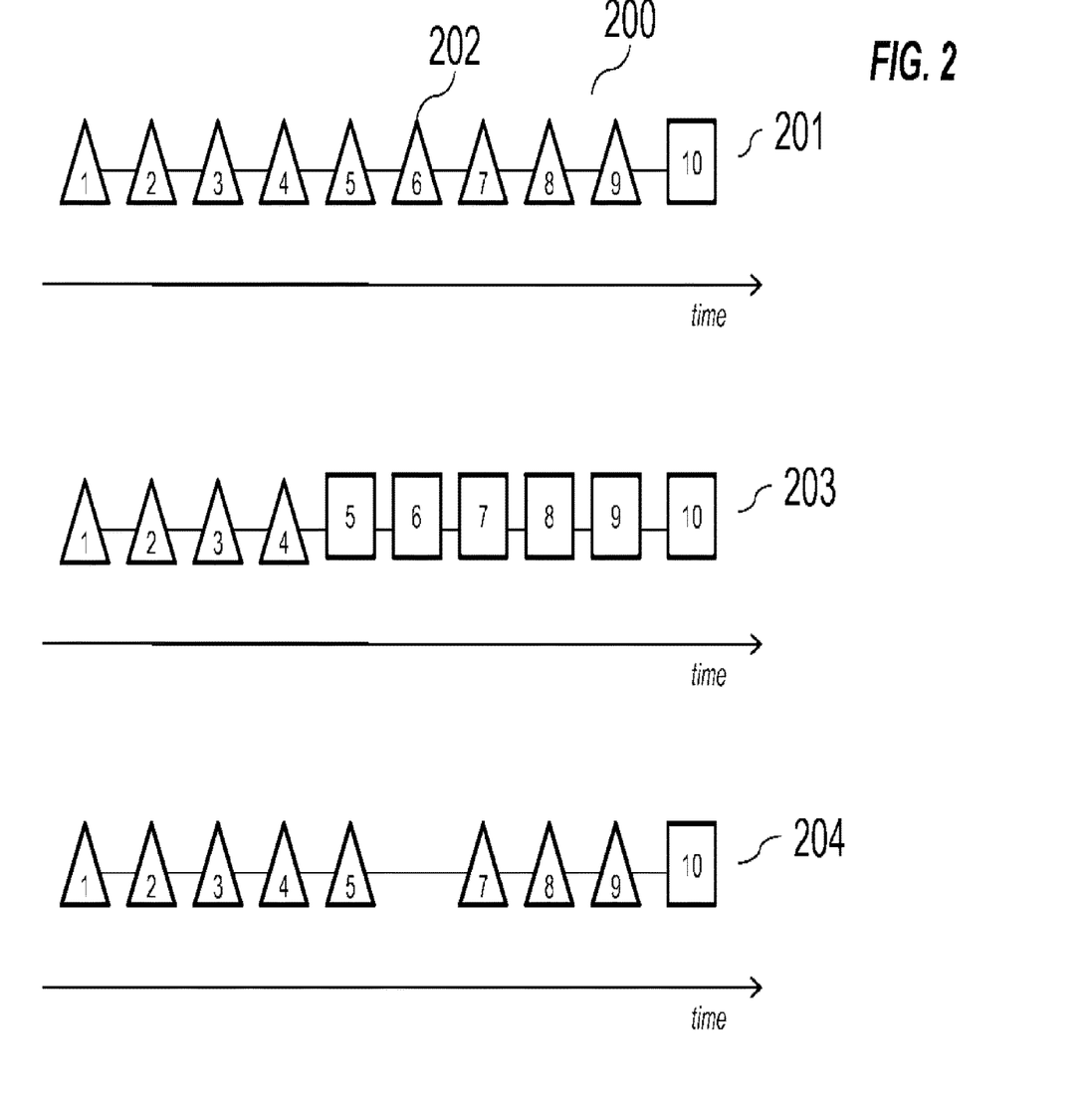
FIG. 2 illustrates an exemplary linear version deletion from a version chain operation.

FIG. 2 illustrates an exemplary conventional linear version chain where a delete operation of a version within a linear version chain must be performed. The version chain 200 can represent a collection of ten versions of a file or file segment over time. FIG. 2 illustrates three phases 201, 203, and 204 during which a version 202 (represented by triangle bearing "6") is deleted from the version chain 200. In phase 201, a version 202 (triangle 6) is selected from the version chain 200 for deletion. Similar to FIG. 1, the most recent version is represented by the square bearing number "10" and its previous versions are presented by triangles bearing numbers 1-9, with triangle 1 being the earliest version of the file and triangle 9 being the version that is just prior the file's version 10. Version 10 can be a full version of the file and/or compressed version. Versions 1-9 can be represented by deltas or differences between the successive versions. A version of a file can be deleted if, for example, a determination is made that such version is no longer necessary to maintain. Hence, this version can be deleted to conserve storage capacity.

In phase 203 of the version deletion process shown in FIG. 2, to eliminate version 6 in the version chain 200, all versions from version 10 to version 5 need to be serially delta-decompressed working from version 10 back to version 5, as shown by the squares 5-10, which indicate that the deltas represented by triangles 5-10 have been decompressed into full versions. Once versions 5-9 have been decompressed, version 6 can be deleted and delta-compression can be applied to the remaining versions 5 and 7-9 to create a new shorter version chain, as shown in phase 204. FIG. 2 further illustrates that longer version chains with thousands of versions can consume an amount of time to process a delete operation on an earlier version that is proportional to the position of version to be deleted within the version chain. Thus, shorter version chains can make for more efficient version deletion operations.

Figure 3A:
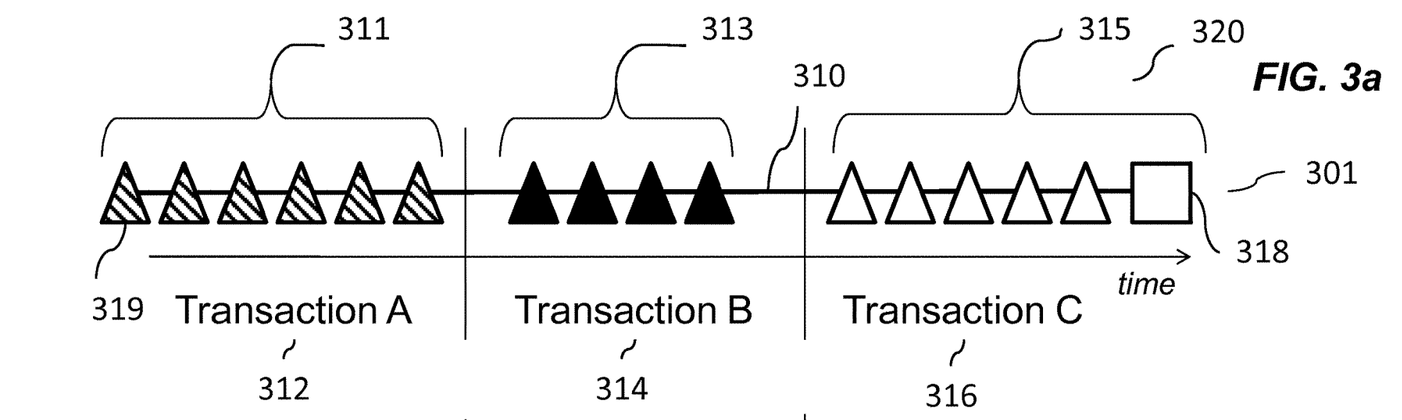
FIG. 3a illustrates an exemplary linear version chain, according to some implementations of the current subject matter.

FIG. 3a illustrates an exemplary version chain 301 prior to clustering, according to some implementations of the current subject matter. The similar files and file segments within and among multiple transactions of one or more data streams have been processed into a version chain 301. An exemplary version chain 301 is shown in FIG. 3a. The version chain 301 includes a most recent version 318 (shown as a square in FIG. 3a) of the data file and a plurality of deltas 311, 313, and 315 (shown as triangles in FIG. 3a). The most recent version 318 and plurality of deltas 311, 313, and 315 are maintained in a linear configuration of versions. As shown in FIG. 3a, the version chain 301 includes 16 versions of a data file, including the most recent version 318. The earliest version of the file (i.e., the earliest point in time) is represented by the triangle 319 and is disposed at the end of the version chain 301. Conventional version chain storage systems store version chain in a linear fashion, whereby to re-create the original, first version in the version chain, n−1 combinations and delta-decompressions need to be performed, where n is a number of versions in the version chain.

The versions in the version chain 301 can be grouped by their co-residence within a transaction of the original data stream. Each version chain can be reorganized to include fewer delta files along a main trunk of the version chain. As shown in FIG. 3a, within version chain 301, three separate transactions are being maintained (transaction A 312, transaction B 314, and transaction C 316). By grouping all of the deltas representing files or file segments within each transaction into their own version cluster, and attaching any one of these deltas within each cluster to the main trunk 310 of a version chain, the effective length of the version chain can be dramatically reduced. For example, the four delta versions 313 of transaction B in FIG. 3a can be arranged with one delta version 303b of the four deltas 314 residing on the main trunk 310 of the version chain in FIG. 3b. The remaining three deltas would be computed as the difference bytes between their content and file 303b.

Figure 3B:
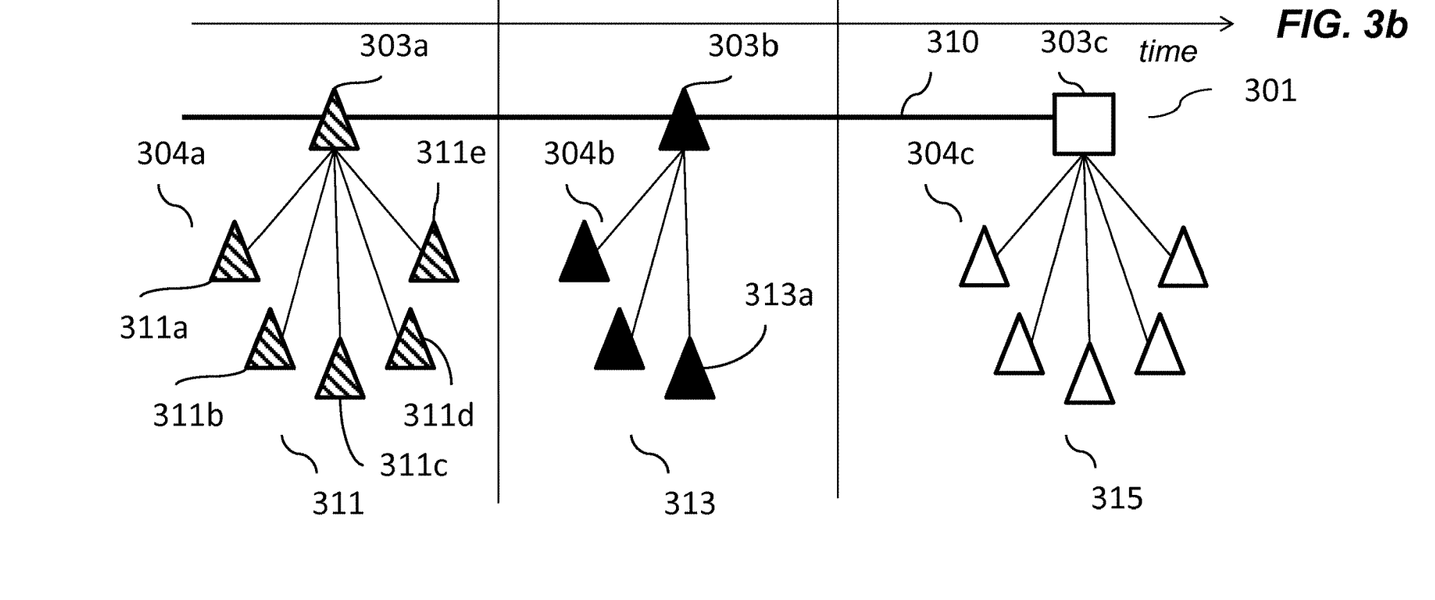
FIG. 3b illustrates an exemplar clustered version chain based on the version chain shown in FIG. 3a, according to some implementations of the current subject matter.

FIG. 3b illustrates an exemplary version chain 301 after clustering has been applied, according to some implementations of the current subject matter. In some implementations, clustering can include selection or designation or identification of a single version within a transaction to represent all versions in that transaction. Any version in the multiple versions in a transaction can be selected as a representative of all versions in that transaction. Hence, the selection or designation or identification of which of multiple versions becomes the representative on the main trunk of the clustered version chain is not critical, and need not even be consistent. In some implementations, the most recent version or the first version can be chosen for convenience. For example, version 303a can be present on the main trunk of the version chain. All versions 311 can be computed as content differences between themselves and version 303a in the transaction A 312, thereby forming cluster 304a. Likewise, version 303b can be present on the main trunk of the version chain. All versions 304b would be computed as content differences between themselves and version 303b in the transaction. Likewise, version 303c can be present on the main trunk of the version chain. All versions 304c that are not a representative version can be computed as content differences between themselves and version 303c in the transaction. The versions within each cluster that are not representative versions are configured to be independent of one another and thus, retrieval, deletion, modification, and/or any other operation on a single version within the cluster does not affect any other versions in that cluster or other clusters within the clustered version chain.

A clustered version chain can greatly reduce the time it takes to recreate earlier versions of files. To recreate the original version 319 using linear version chain shown in FIG. 3a, it can take 15 delta decompression operations. To recreate any of the versions 311 (which can include the original version 319) using some embodiments of the current subject matter shown in FIG. 3b, it can take 3 delta decompression operations. Thus, this yields an effective speedup factor of 5.

A clustered version chain can also greatly reduce the time it takes to delete various delta versions within a version chain. Within a single cluster, any of the leaf node deltas (304a, 304b, 304c) that are to be deleted can simply be deleted without the need to delta decompress any other files.

Another common version deletion request can include elimination of all delta files associated with a specific transaction. Instead of having to serially delta-decompress and eliminate each version within a transaction in the linear version chain, with the clustered version chain, just the representative deltas that are on the main trunk 310 can be involved in the deletion of the version that is on the main trunk that represents that transaction.

In some implementations, to retrieve a particular version of a data file from a version chain, the current subject matter's system can be configured to determine its designated representative. For example, to retrieve a version of a file in the cluster 304a, the current subject matter can determine that its designated representative version is 303a, as shown in FIG. 3b. Using the designated representative 303a, the current subject matter's system can be configured to retrieve a version from the cluster represented by the representative 303a. This greatly increases speed and efficiency of the retrieval process, as the current subject matter's system decompresses versions that are stored on the main trunk 310, i.e., designated representative versions 303a, 303b, 303c (if version 303c is a full uncompressed version of the data file, it need not be decompressed) as well as delta-decompresses versions that correspond to the desired version within the cluster. For example, if version 311a in the cluster 311 is desired to be retrieved, the current subject matter's system can be configured to decompress version 303b, then decompress version 303a and combine it with decompressed version 303b, and then decompress version 311a and combine it with the decompressed versions 303a and 303b. Thus, acquiring an earlier version of a file using the current subject matter's system is more efficient based on the degree of clustering. For example, retrieving the first version of a file (version 319 shown in FIG. 3a or version 311a shown in FIG. 3b), the number of delta compression operations is reduced from fifteen in the linear version chain (FIG. 3a) to three operations. This is significant savings of the processing time and system power.

In some implementations, deletion of a particular version can also be accelerated using the current subject matter's system. Deletions for many applications can be transactional in nature. This can be true of backup data sets. Deletion of an entire transaction can be minimized by the shorter length of the main trunk. Further, by deleting the node of a transaction on the main trunk, all other versions can be quickly deleted since they only depend on the version attached to the main trunk.

In the linear version chain 301 shown in FIG. 3a, deletion of all versions from transaction B 314 can involve ten delta de-compression operations, 4 deletions and a delta compression operation to connect the most recent version of transaction A 312 to the least recent version of transaction C 312. In the clustered version chain 301 shown in FIG. 3b, the deletion of transaction B can involve two delta-decompress operations, with the same number of deletion and delta compression operations to attach the main trunk version of transaction A 312 to the main trunk version of transaction C 316. Deletions of a particular version within a cluster of versions can also be made using the versions contained on the main trunk. For example, version 313a can simply be deleted since it has no dependencies. Further, all versions 304a can be deleted without any effect on versions 304b or 304c, as versions 304a, 304b, and 304c do not depend on one another.

In addition to version chain operation efficiency, the clustered version chain can reduce the probability of version chain data loss when a single version becomes corrupt anywhere in the chain. Since the recreation of any earlier version in the chain can require that all more recent versions be substantially error free, a linear version chain is less reliable than the clustered equivalent. The first version 319 in the linear version chain 301 shown in FIG. 3a can require that all of the versions in the version chain be error free in order for it to be recreated in its whole form. In the clustered version chain 301 shown in FIG. 3b, only the versions that are on the main trunk 310, i.e. versions 303a, 303b, 303c (if version 303c is not an uncompressed version) and the single version in a selected cluster 304a, 304b, 304c of versions that needs to be recreated must be substantially error free. Thus, the linear version chain 301 shown in FIG. 3a can require that all sixteen versions be error free while in the clustered version chain 301 shown in FIG. 3b, at most only four versions can be required to be substantially error free.

Figure 4:
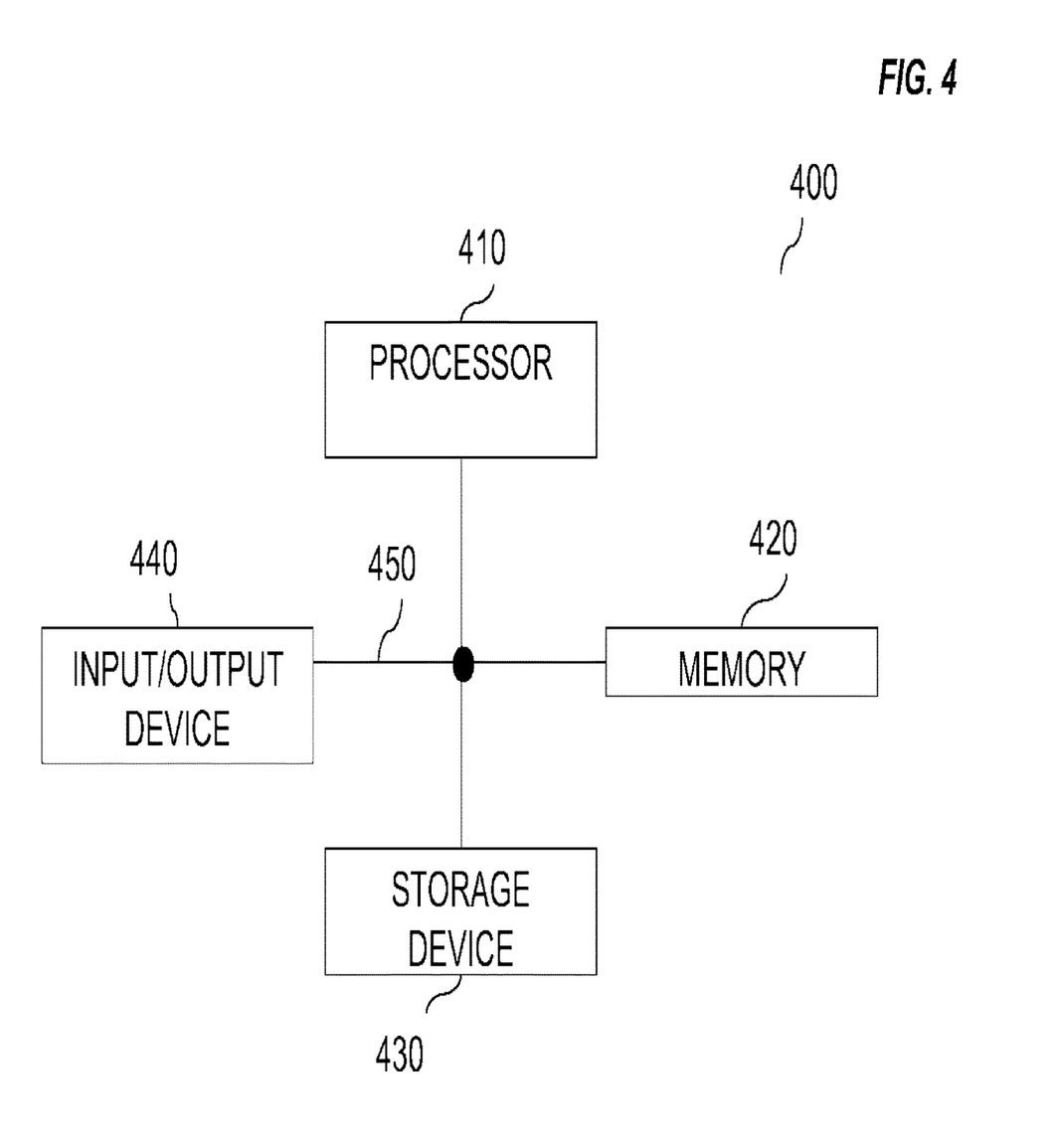
FIG. 4 illustrates an exemplary system for storing data, according to some implementations of the current subject matter.

In some implementations, the current subject matter can be configured to be implemented in a system 400, as shown in FIG. 4. The system 400 can include a processor 410, a memory 420, a storage device 430, and an input/output device 440. Each of the components 410, 420, 430 and 440 can be interconnected using a connection 450. The processor 410 can be configured to process instructions for execution within the system 400. The processor 410 can be further configured to process various instructions and perform operations, including those shown in FIG. 5, as well as those that are stored in the memory 420 or on the storage device 430, including receiving or sending information through the input/output device 440. The memory 420 can store information within the system 400. In some implementations, the memory 420 can be a computer-readable medium, a volatile memory unit, a non-volatile memory unit, or any other suitable medium/unit. The storage device 430 can be capable of providing mass storage for the system 400 and can be a computer-readable medium, a floppy disk device, a hard disk device, an optical disk device, a tape device, non-volatile solid state memory, or any other suitable storage device. The input/output device 440 can be a network interface and/or any other system, device, and/or any combination thereof.

Figure 5:
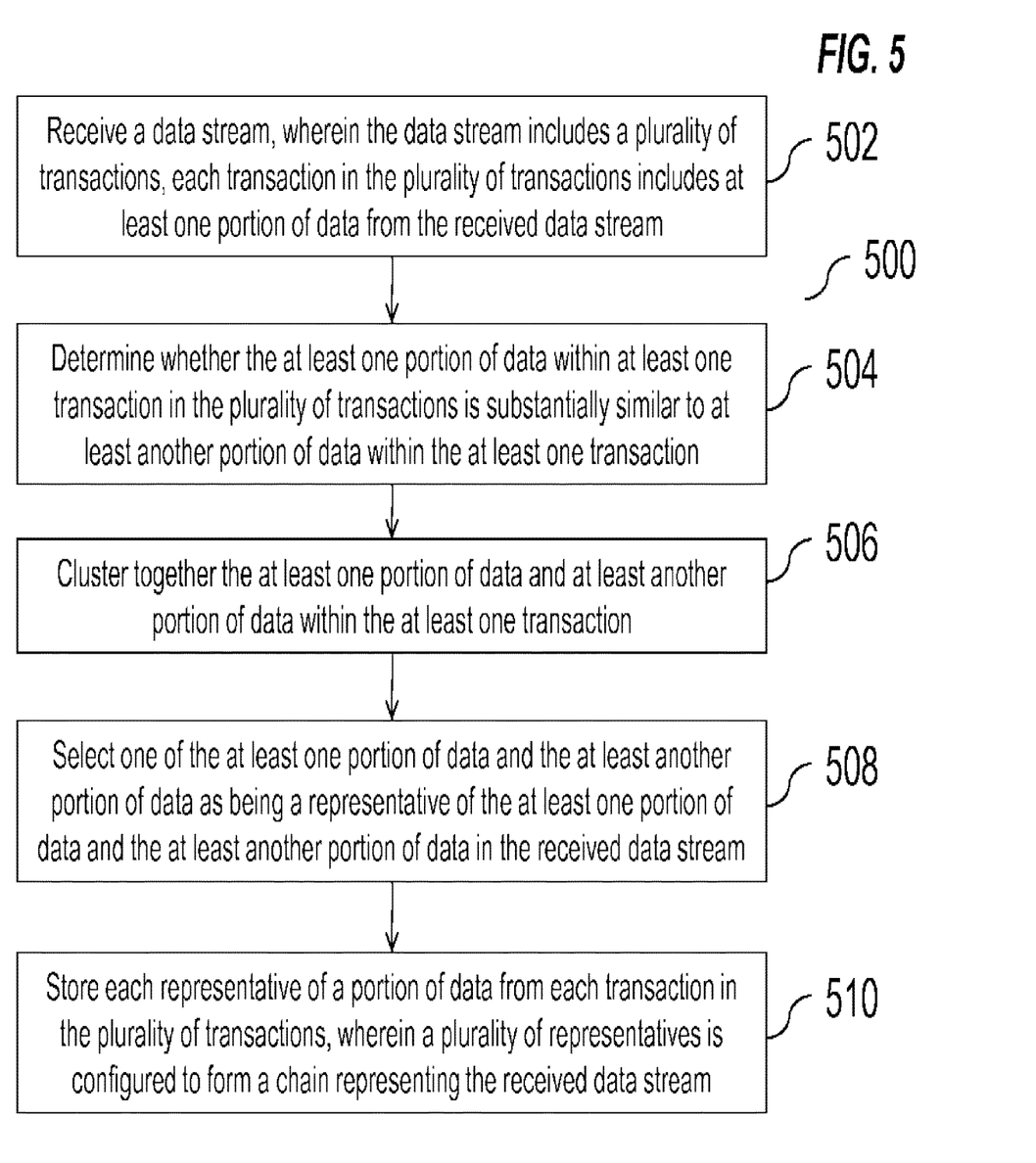
FIG. 5 illustrates an exemplary method for storing data, according to some implementations of the current subject matter.

In some implementations, the current subject matter relates to a computer-implemented method 500 for storing data. At 502, a data stream can be received, wherein the data stream includes a plurality of transactions, each transaction in the plurality of transactions includes at least one portion of data from the received data stream. At 504, a determination can be made whether the at least one portion of data within at least one transaction in the plurality of transactions is substantially similar to at least another portion of data (or a another version of data or another delta-compressed version of data or another delta/difference representing another version of data) within the at least one transaction. At 506, at least one portion of data and at least another portion of data within the at least one transaction can be clustered together. At 508, one of the at least one portion of data and the at least another portion of data can be selected as being a representative (e.g., representative 303a, 303b, or 303c shown in FIG. 3b) of the at least one portion of data and the at least another portion of data in the received data stream. At 510, each representative of a portion of data from each transaction in the plurality of transactions can be stored. A plurality of representatives can be configured to form a chain representing the received data stream. At least one of the receiving, the determining, the clustering, the selecting, and the storing is performed on at least one processor.

In some implementations, the current subject matter can be configured to include at least one of the following optional features. At least one portion of data can be at least one compressed portion of data and the at least another portion of data is at least another compressed portion of data. The representative can be a compressed representative of the at least one portion of data and the at least another portion of data. The representative can be a delta-compressed representative of at least one portion of data and at least another portion of data. The portions of data that are not selected representatives can be configured to be independent of each other, thereby reducing a number of dependencies among the portions of data that are not selected representatives (in some embodiments, all dependencies among the portions of data that are not selected representatives can be eliminated).

The method can include determining whether a third portion of data included in at least one transaction within the plurality of transaction is designated for deletion, determining a representative that designates the third portion of data, and deleting the representative that designates the third portion of data, and deleting all portions of data that the representative that designates the third portion of data is configured to represent. The method can include determining whether a third portion of data included in at least one transaction within the plurality of transaction is designated for deletion, determining a representative that designates the third portion of data, and deleting the third portion of data without deleting the representative that designates the third portion of data and other portions of data that the representative that designates the third portion of data is configured to represent. At least one portion of data can be configured to be a version of a data file within the received data stream and at least another portion of data can be configured to be another version of the data file within the received data stream. The version of the data file and another version of the data file can be compressed. The storing can further include storing compressed versions of the data file in at least one storage location (e.g., a repository, a memory, a disk, a physical storage, a virtual storage, and/or any other storage system, device, and/or mechanism).

The method can include uncompressing the representative of the at least one portion of data and the at least another portion of data, retrieving, based on the uncompressing, at least one of an uncompressed version and an uncompressed another version of the data file from the at least one storage location. The processing time for the retrieving can be based on a number of representatives configured to represent at least one transaction in the plurality of transactions and configured to be uncompressed to retrieve the uncompressed version.

The method can further include repeating the determining, the clustering, and the selecting for each portion of the data in the received data stream. The method can also include storing portions of data that are not selected as a representative.

In some embodiments, the clustered at least one portion of data and the clustered at least another portion of data are configured to have no dependencies on one another.

The systems and methods disclosed herein can be embodied in various forms including, for example, a data processor, such as a computer that also includes a database, digital electronic circuitry, firmware, software, or in combinations of them. Moreover, the above-noted features and other aspects and principles of the present disclosed implementations can be implemented in various environments. Such environments and related applications can be specially constructed for performing the various processes and operations according to the disclosed implementations or they can include a general-purpose computer or computing platform selectively activated or reconfigured by code to provide the necessary functionality. The processes disclosed herein are not inherently related to any particular computer, network, architecture, environment, or other apparatus, and can be implemented by a suitable combination of hardware, software, and/or firmware. For example, various general-purpose machines can be used with programs written in accordance with teachings of the disclosed implementations, or it can be more convenient to construct a specialized apparatus or system to perform the required methods and techniques.

The systems and methods disclosed herein can be implemented as a computer program product, i.e., a computer program tangibly embodied in an information carrier, e.g., in a machine readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

As used herein, the term "user" can refer to any entity including a person or a computer.

Although ordinal numbers such as first, second, and the like can, in some situations, relate to an order; as used in this document ordinal numbers do not necessarily imply an order. For example, ordinal numbers can be merely used to distinguish one item from another. For example, to distinguish a first event from a second event, but need not imply any chronological ordering or a fixed reference system (such that a first event in one paragraph of the description can be different from a first event in another paragraph of the description).

The foregoing description is intended to illustrate but not to limit the scope of the invention, which is defined by the scope of the appended claims. Other implementations are within the scope of the following claims.

These computer programs, which can also be referred to programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, the subject matter described herein can be implemented on a computer having a display device, such as for example a cathode ray tube (CRT) or a liquid crystal display (LCD) monitor for displaying information to the user and a keyboard and a pointing device, such as for example a mouse or a trackball, by which the user can provide input to the computer. Other kinds of devices can be used to provide for interaction with a user as well. For example, feedback provided to the user can be any form of sensory feedback, such as for example visual feedback, auditory feedback, or tactile feedback; and input from the user can be received in any form, including, but not limited to, acoustic, speech, or tactile input.

The subject matter described herein can be implemented in a computing system that includes a back-end component, such as for example one or more data servers, or that includes a middleware component, such as for example one or more application servers, or that includes a front-end component, such as for example one or more client computers having a graphical user interface or a Web browser through which a user can interact with an implementation of the subject matter described herein, or any combination of such back-end, middleware, or front-end components. The components of the system can be interconnected by any form or medium of digital data communication, such as for example a communication network. Examples of communication networks include, but are not limited to, a local area network ("LAN"), a wide area network ("WAN"), and the Internet.

The computing system can include clients and servers. A client and server are generally, but not exclusively, remote from each other and typically interact through a communication network. The relationship of client and server arises by virtue of computer programs running on the respective computers and having a client-server relationship to each other.

The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. Other implementations can be within the scope of the following claims.

What is claimed:

1. A computer-implemented method for retrieving data, comprising:
   receiving a request to retrieve a version of data in a plurality of versions of data;
   identifying a data cluster in a plurality of data clusters, the identified data cluster storing a plurality of delta-compressed versions of data including and a cluster representative, the cluster representative being a delta-compressed version in the plurality of delta-compressed versions, wherein each of the plurality of delta-compressed versions of data stored in the cluster are independent of each other and include one or more respective content differences with the cluster representative, wherein the identified data cluster stores a delta-compressed version of data corresponding to the requested version of data;
   uncompressing the cluster representative of the identified data cluster and the delta-compressed version of data corresponding to the requested version of data;
   combining the uncompressed cluster representative and the uncompressed delta-compressed version of data; and
   retrieving, based on the combining, the requested version of data.

2. The method according to claim 1, wherein each data cluster in the plurality of data clusters includes a respective cluster representative, each cluster representative being stored in a memory location.

3. The method according to claim 2, wherein the uncompressing further comprises uncompressing the cluster representative of the identified data cluster, the delta-compressed version of data corresponding to the requested version of data, and at least another cluster representative.

4. The method according to claim 3, wherein the combining further comprises combining the uncompressed cluster representative, the uncompressed delta-compressed version of data, and the uncompressed another cluster representative.

5. The method according to claim 1, wherein the identified data cluster is configured to represent a logical portion of a data stream received for backup and including a plurality of versions of data.

6. The method according to claim 1, wherein the cluster representative includes at least one of the following: a delta-compressed version of data and a data-compressed version of data.

7. The method according to claim 1, where the request to retrieve the version of data includes a request to delete the version of data, wherein the retrieved version of data is deleted without deleting the cluster representative.

8. The method according to claim 1, wherein the request to retrieve the version of data includes a request to delete the identified data cluster, the method further comprises
performing, for each delta-compressed version stored in the data cluster, the uncompressing and the combining;
deleting each uncompressed and combined delta-compressed version and the cluster representative.

9. The method according to claim 1, wherein the request to retrieve the version of data includes a request to delete the cluster representative of the identified data cluster, wherein the operations further comprise
determining whether at least one delta-compressed version of data is stored in the data cluster;
deleting, based on the determining, all delta-compressed versions of data stored in the identified data cluster prior to deleting the cluster representative of the identified data cluster; and
deleting the cluster representative of the identified data cluster.

10. The method according to claim 3, wherein a processing time for the retrieving is determined based on a number of cluster representatives configured to represent at least one transaction in a plurality of transactions of a data stream received for a backup and configured to be uncompressed to retrieve the requested version of data.

11. A system comprising:
at least one programmable processor; and
a non-transitory machine-readable medium storing instructions that, when executed by the at least one programmable processor, cause the at least one programmable processor to perform operations comprising:
receiving a request to retrieve a version of data in a plurality of versions of data;
identifying a data cluster in a plurality of data clusters, the identified data cluster storing a plurality of delta-compressed versions of data including and a cluster representative, the cluster representative being a delta-compressed version in the plurality of delta-compressed versions, wherein each of the plurality of delta-compressed versions of data stored in the cluster are independent of each other and include one or more respective content differences with the cluster representative, wherein the identified data cluster stores a delta-compressed version of data corresponding to the requested version of data;
uncompressing the cluster representative of the identified data cluster and the delta-compressed version of data corresponding to the requested version of data;
combining the uncompressed cluster representative and the uncompressed delta-compressed version of data; and
retrieving, based on the combining, the requested version of data.

12. The system according to claim 11, wherein each data cluster in the plurality of data clusters includes a respective cluster representative, each cluster representative being stored in a memory location.

13. The system according to claim 12, wherein the uncompressing further comprises uncompressing the cluster representative of the identified data cluster, the delta-compressed version of data corresponding to the requested version of data, and at least another cluster representative.

14. The system according to claim 13, wherein the combining further comprises combining the uncompressed cluster representative, the uncompressed delta-compressed version of data, and the uncompressed another cluster representative.

15. The system according to claim 11, wherein the identified data cluster is configured to represent a logical portion of a data stream received for backup and including a plurality of versions of data.

16. The system according to claim 11, wherein the cluster representative includes at least one of the following: a delta-compressed version of data and a data-compressed version of data.

17. The system according to claim 11, where the request to retrieve the version of data includes a request to delete the version of data, wherein the retrieved version of data is deleted without deleting the cluster representative.

18. The system according to claim 11, wherein the request to retrieve the version of data includes a request to delete the identified data cluster, the method further comprises
performing, for each delta-compressed version stored in the data cluster, the uncompressing and the combining;
deleting each uncompressed and combined delta-compressed version and the cluster representative.

19. The system according to claim 11, wherein the request to retrieve the version of data includes a request to delete the cluster representative of the identified data cluster, wherein the operations further comprise
determining whether at least one delta-compressed version of data is stored in the data cluster;
deleting, based on the determining, all delta-compressed versions of data stored in the identified data cluster prior to deleting the cluster representative of the identified data cluster; and
deleting the cluster representative of the identified data cluster.

20. The system according to claim 13, wherein a processing time for the retrieving is determined based on a number of cluster representatives configured to represent at least one transaction in a plurality of transactions of a data stream received for a backup and configured to be uncompressed to retrieve the requested version of data.

21. A computer program product comprising a non-transitory machine-readable medium storing instructions that, when executed by at least one programmable processor, cause the at least one programmable processor to perform operations comprising receiving a request to retrieve a version of data in a plurality of versions of data;

identifying a data cluster in a plurality of data clusters, the identified data cluster storing a plurality of delta-compressed versions of data including and a cluster representative, the cluster representative being a delta-compressed version in the plurality of delta-compressed versions, wherein each of the plurality of delta-compressed versions of data stored in the cluster are independent of each other and include one or more respective content differences with the cluster representative, wherein the identified data cluster stores a delta-compressed version of data corresponding to the requested version of data;

uncompressing the cluster representative of the identified data cluster and the delta-compressed version of data corresponding to the requested version of data;

combining the uncompressed cluster representative and the uncompressed delta-compressed version of data; and retrieving, based on the combining, the requested version of data.

22. The computer program product according to claim 21, wherein each data cluster in the plurality of data clusters includes a respective cluster representative, each cluster representative being stored in a memory location.

23. The computer program product according to claim 22, wherein the uncompressing further comprises uncompressing the cluster representative of the identified data cluster, the delta-compressed version of data corresponding to the requested version of data, and at least another cluster representative.

24. The computer program product according to claim 23, wherein the combining further comprises combining the uncompressed cluster representative, the uncompressed delta-compressed version of data, and the uncompressed another cluster representative.

25. The computer program product according to claim 21, wherein the identified data cluster is configured to represent a logical portion of a data stream received for backup and including a plurality of versions of data.

26. The computer program product according to claim 21, wherein the cluster representative includes at least one of the following: a delta-compressed version of data and a data-compressed version of data.

27. The computer program product according to claim 21, where the request to retrieve the version of data includes a request to delete the version of data, wherein the retrieved version of data is deleted without deleting the cluster representative.

28. The computer program product according to claim 21, wherein the request to retrieve the version of data includes a request to delete the identified data cluster, the method further comprises performing, for each delta-compressed version stored in the data cluster, the uncompressing and the combining;

deleting each uncompressed and combined delta-compressed version and the cluster representative.

29. The computer program product according to claim 21, wherein the request to retrieve the version of data includes a request to delete the cluster representative of the identified data cluster, the method further comprises determining whether at least one delta-compressed version of data is stored in the data cluster;

deleting, based on the determining, all delta-compressed versions of data stored in the identified data cluster prior to deleting the cluster representative of the identified data cluster; and deleting the cluster representative of the identified data cluster.

30. The computer program product according to claim 23, wherein a processing time for the retrieving is determined based on a number of cluster representatives configured to represent at least one transaction in a plurality of transactions of a data stream received for a backup and configured to be uncompressed to retrieve the requested version of data.

* * * * *